United States Patent [19]

Diep et al.

[11] Patent Number: 5,719,827
[45] Date of Patent: Feb. 17, 1998

[54] HIGHLY STABLE FREQUENCY GENERATOR

[75] Inventors: Minh-Tam Diep, Nyon; Emil Zellweger, Lommiswil; Rudolf Dinger, St-Aubin; Pierre-André Farine, Neuchâtel, all of Switzerland

[73] Assignee: Aulab S.A., Bienne, Switzerland

[21] Appl. No.: 544,892

[22] Filed: Oct. 18, 1995

[30] Foreign Application Priority Data

Nov. 4, 1994 [FR] France .................. 94 13241

[51] Int. Cl.$^6$ ............................ G04C 11/02; G04B 17/20
[52] U.S. Cl. .................................... 368/47; 368/202
[58] Field of Search .......................... 368/200–203, 368/47–58

[56] References Cited

U.S. PATENT DOCUMENTS

| | | | |
|---|---|---|---|
| 4,241,435 | 12/1980 | Fujita et al. | 368/85 |
| 4,427,302 | 1/1984 | Watanabe | 368/200 |
| 4,502,790 | 3/1985 | Yokoyama | 368/200 |
| 4,537,515 | 8/1985 | Dinger et al. | 368/202 |
| 4,761,771 | 8/1988 | Moriya et al. | 368/202 |

FOREIGN PATENT DOCUMENTS

| | | |
|---|---|---|
| 0 047 320 | 3/1982 | European Pat. Off. |
| 0 133 388 | 2/1985 | European Pat. Off. |
| 599 609 | 6/1977 | Switzerland |
| 650 122 | 7/1985 | Switzerland |
| 2 095 005 | 9/1982 | United Kingdom |
| 2 162 974 | 2/1986 | United Kingdom |

OTHER PUBLICATIONS

Proceedings of the 1992 IEEE International Conference on Industrial and Automation, 9–13 Nov., 1992, San Diego, USA vol. 3/3, pp. 1582–1587.

*Primary Examiner*—Bernard Roskoski
*Attorney, Agent, or Firm*—Griffin, Butler, Whisenhunt & Kurtossy

[57] ABSTRACT

A highly stable frequency generator (G) comprises an oscillator (10) for generating a first frequency (F1), and further comprises a time base (BT) providing a time stable frequency signal which is independent of the temperature, and a feedback circuit arranged to provide a first number of pulses ($n_T$) coming from the oscillator (10) to a comparing circuit (13), a circuit (14) for providing a reference number of pulses ($N_T$) to said comparing circuit (13), and a circuit (13,15,16) providing a correction signal (Sc) as a function of the difference ($\Delta$) between the first number ($n_T$) and the reference number ($N_T$), the generator (G) further comprising a correction circuit (17) of the oscillation frequency (F1) of said first oscillator (10), this correction circuit being controlled by said control signal (Sc).

8 Claims, 4 Drawing Sheets

HIGHLY STABLE FREQUENCY GENERATOR

FIELD OF THE INVENTION

The present invention concerns a frequency generator comprising a first high frequency oscillator, suitable for example for telecommunication use.

Such a generator may be part of an analogue system using frequency modulation with a limited bandwidth, as can be found for example in cellular phones, cordless phones or also in portable radio-frequency apparatus etc. Also, the generator may be part of a digital system as can be found for example in pager systems, such as pager-watches. A pager-watch is a wristwatch provided with an integrated radio receiver, capable of receiving and processing radio-diffused messages intended to locate persons.

BACKGROUND OF THE INVENTION

In known frequency generators, the oscillator is usually not stabilised, neither as far as the time is concerned nor as far as the surrounding temperature is concerned. And even if this oscillator comprises a stabiliser, the latter normally only serves for compensating temperature influences. Furthermore, this compensation functions in general only for a very limited temperature range. Such thermo-compensated oscillators are known under the name TCXO (which is an abreviation for Temperature Controlled Crystal Oscillator).

However, if a frequency generator and its oscillator are to be stabilised over a larger temperature range, an expensive compensation circuit is required. Such a circuit is often considered too expensive. Furthermore, as has already been observed, the compensation circuit compensates only for the deviations of the oscillator due to temperature influences, which does not suffice in the case of ensuring a durable stability.

For the utilisations intended by the present invention, the frequency precision of the frequency generator must be around ±2 to ±3 ppm ($10^{-6}$). This supposes at least the use of a TCXO oscillator in the generator. However a TCXO oscillator is not time stabilised, and its ageing may cause a frequency deviation of 1 to 2 ppm ($10^{-6}$) per year. Its ageing is due to the quartz of the oscillator, which provides a signal which varies with time. The ageing of the oscillator may thus play an important role in the change of the stability of a frequency generator.

Thus, when the oscillator ages or if the generator is used outside of the authorised temperature range, the frequency variation of the oscillator of the frequency generator will become quite large so that the difference between the actual frequency and the nominal frequency of the oscillator could becomes too large. If the generator is incorporated into a radio-signal receiver, for example, the sensitivity of the latter might thus be diminished or the detected signal might be deformed and this deformation might produce noise on the useful signal.

It is thus necessary to stabilise efficiently the oscillator of the frequency generator, preferably by a compensation circuit which is relatively cheap compared to the price of the complete generator.

SUMMARY OF THE INVENTION

An aim of the present invention is to provide a solution to this problem by providing a frequency generator which is not expensive and which is very stable, even over a longer period of time, and which is independent of the temperature influence.

This aim is obtained thanks to a highly stable frequency generator comprising a first oscillator intended to generate a first frequency, characterised in that it further comprises:
- a time base comprising a second oscillator intended to generate a second frequency, and a compensation circuit for the second oscillator, this time base providing a frequency signal which is stable in time and which is independent of the temperature,
- apparatus for defining a time interval determined by said stable frequency signal, and
- a feedback circuit comprising:
  - a counter arranged to count a first number of pulses coming from said first oscillator during said time interval, and arranged to provide the first number to comparing circuit associated to said counter,
  - a circuit for providing a reference number of pulses to said comparing circuit, and
  - a circuit for providing a correction signal as a function of the difference between said first number and said reference number, said generator further comprising a correction circuit of the oscillation frequency of said first oscillator, the correction circuit being controlled by said correction signal.

The aim is also obtained thanks to a highly stable frequency generator comprising a first oscillator intended to generate a first frequency, characterised in that it further comprises a time base comprising:
- a second oscillator intended to generate a second frequency, and compensation means of said second oscillator providing a number of correction pulses $N_x$ representative of a correction to be performed, this time base providing a time stable frequency signal which is independent of the temperature,
- a circuit for defining a time interval determined by said second oscillator, and
- a feedback circuit comprising:
  - a counter arranged to count a first number of pulses coming from said first oscillator during said time interval and arranged to provide the first number of pulses to a calculation circuit for calculating the sum of said first number and said correction number,
  - a compare circuit arranged to receive said sum provided by said calculation circuit,
  - a circuit providing a reference number of pulses to said compare circuit, and
  - a circuit providing a correction signal as a function of the difference between said sum and said reference number, the generator further comprising a correction circuit of the oscillation frequency of said first oscillator, the correction circuit being controlled by said correction signal.

The solution presented by the invention consists in coupling the oscillator providing the useful frequency to a second oscillator, or a reference oscillator, which has a high stability thanks to the fact that it is thermo-compensated and which comprises a electronic ageing compensation circuit conceived according to a known principal in watch-technology for ensuring what specialists call "running convergence".

Advantageously, such a highly stable generator according to the invention may be used in timepieces such as pager-watches.

BRIEF DESCRIPTION OF THE DRAWINGS

The object of the invention is described hereafter, merely by way of example, by two embodiments with reference to the accompanying drawings, in which.

DESCRIPTION OF PREFERRED EMBODIMENTS

Figure 1:
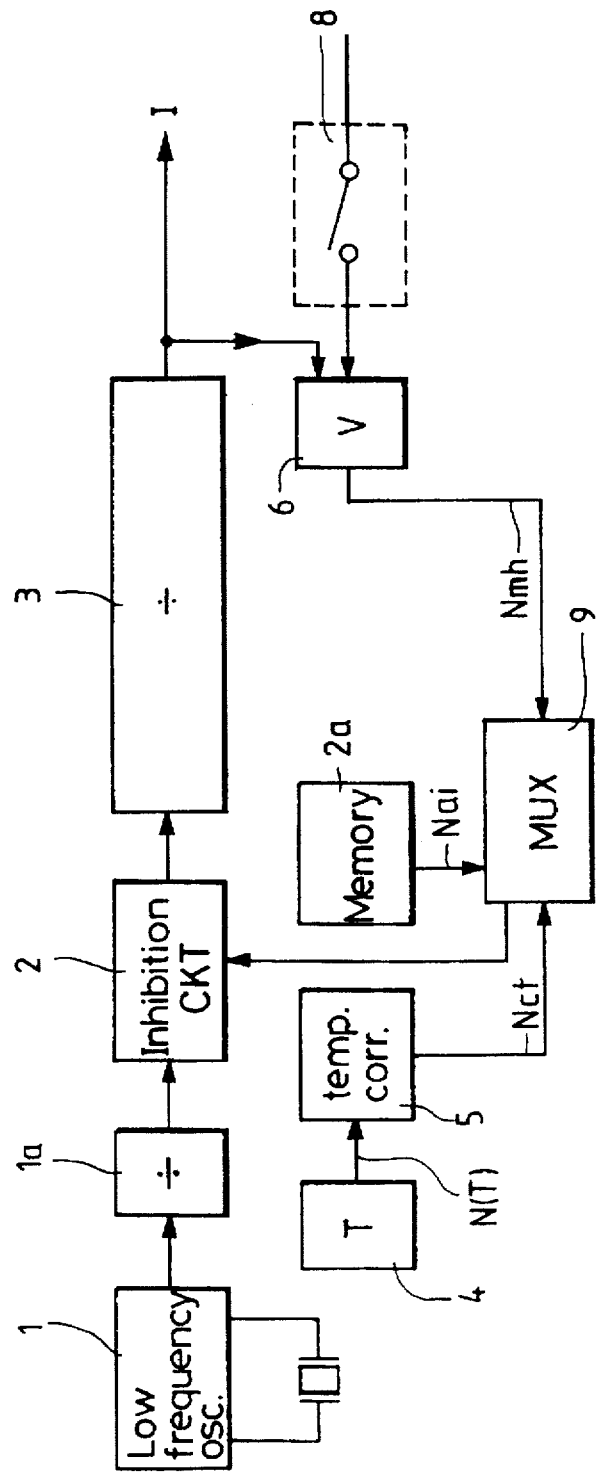
FIG. 1 represents a block diagram of a highly stable timepiece which may be used in the generator according to the invention.

FIG. 1 is a block diagram representing a highly stable time base comprising a low frequency oscillator 1, for example a watch oscillator controlled by a quartz resonator which is arranged to provide an output signal having a nominal frequency of 32768 Hz. This oscillator 1 is coupled to an inhibition circuit 2 by way of a first divisor 1a. The inhibition circuit 2 is associated to an electronic circuit comprising a division chain 3, arranged to transform the output signal provided by the inhibition circuit 2 into a divided signal I, the frequency of which is adapted according to the intended use. For example, in the case of a watch such as a pager watch, the divisor 1a and the division chain 3 present together a divisor rate equal to 32 768 so that the signal I has a frequency of 1 Hz, when the signal provided by oscillator 1 is at its nominal frequency and while the inhibition circuit 2 does not block any pulses. Signal I may be used to control the step motor coupled to the driving chain for driving a display.

However, the actual frequency as delivered by the quartz of the low frequency oscillator 1 changes in time and depends on the surrounding temperature. For example, for a watch oscillator of which the quartz vibrates at its nominal frequency at a temperature of 25° C., the error of this frequency may reach 20 ppm or more over a temperature range of −10° to +50° C.

It is thus necessary to compensate for the effect of the temperature on the frequency delivered by the quartz of low frequency oscillator 1.

Several systems have been proposed for thermally compensating a time base, for example in the U.S. Pat. No. 4,761,771 or the Swiss patent CH-B-650 122.

In the time base shown in FIG. 1, this compensation may be performed by the principal described in the patent U.S. Pat. No. 4,761,771.

According to this principal, an inhibition circuit 2 blocks periodically a number $N_{ct}$ and a number $N_{ai}$ of pulses of the signal provided by divisor 1a, and this with a periodicity of $I_T$ seconds.

The number $N_{ct}$ is the number of pulses to be blocked so that the frequency of signal I would be independent of the temperature, and it is produced by a correction circuit 5 which receives an information N(T) from a temperature sensitive sensor 4.

The number $N_{ai}$ is the number of pulses to be blocked to take into account a voluntary made error during the fabrication of the resonator of oscillator 1 with respect to its maximum frequency, this number being stocked in a memory 2a.

A multiplexer 9 provides successively the number $N_{ct}$ and the number $N_{ai}$ to an inhibition circuit 2.

The frequency of the signal provided by oscillator 1 also changes because of the ageing of its quartz.

In the time base shown in FIG. 1, the compensation for its ageing is obtained by the principal known under the name of "running conversion" and is described in the Swiss patent CH-B-599 609.

In short, to correct the frequency of signal I, it is necessary to remove, firstly, an invariable number $N_{ai}$ of pulses to take into account the initial adjustment (voluntary error), secondly, a variable number $N_{ct}$ of pulses to take into account the variation of the frequency of oscillator 1 due to the temperature, and, thirdly, a number $N_{mh}$, also variable, of pulses to take into account the ageing of the quartz of oscillator 1.

Figure 2:
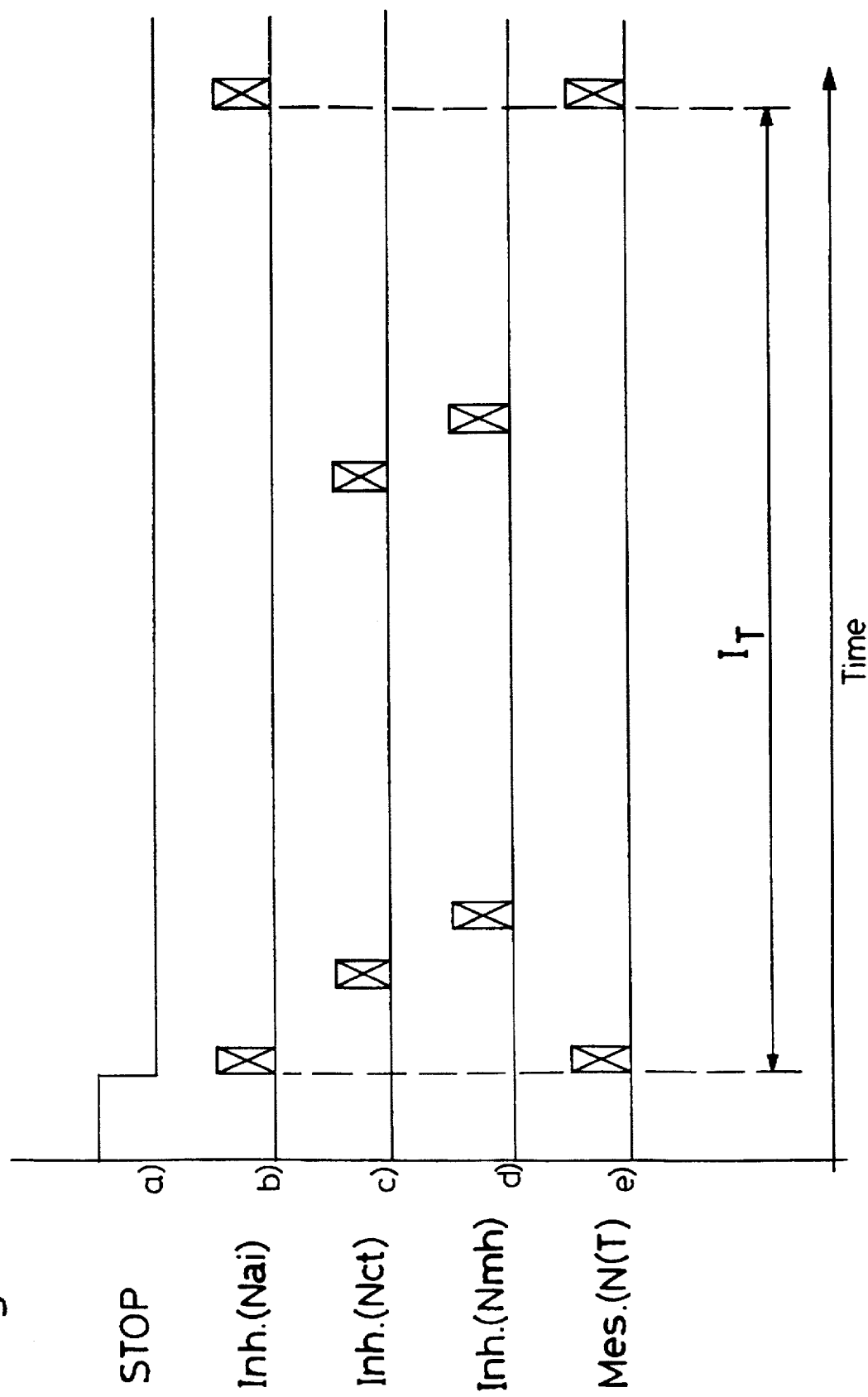
FIG. 2 represents a timing chart of a time interval $I_T$ showing the corrections to be performed.

These different numbers are provided successively to inhibition circuit 2 by multiplexer 9, in such a way as is shown by way of example in FIG. 2. As can be seen this example, multiplexer 9 provides the number $N_{ai}$ to inhibition circuit 2 at the start of each period $I_T$. Simultaneously, sensor 4 measures the temperature and transmits the signal N(T) to circuit 5. The latter then determines the number $N_{ct}$ which is then transmitted to inhibition circuit 2 by multiplexer 9. An instant later, multiplexer 9 transmits the number. $N_{mh}$ to inhibition circuit 2.

Figure 3:
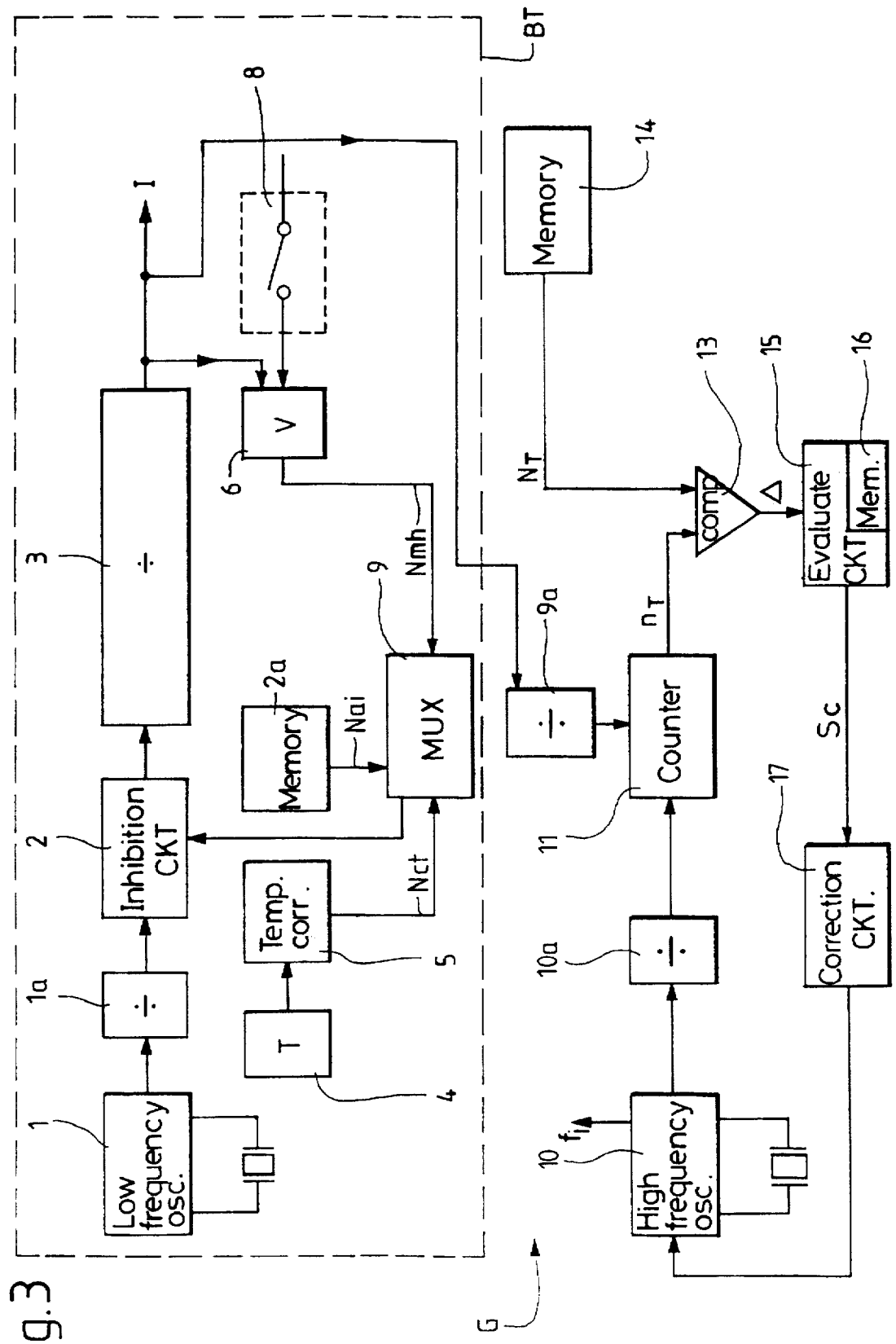
FIG. 3 represents a block diagram of the generator according to the invention in a first embodiment.

FIG. 3 represent a block diagram of the generator G according to the invention in a first embodiment.

Generator G comprises first of all a circuit BT such as is represented in FIG. 1. The frequency generator G further comprises a high frequency oscillator 10 which may be part of, for example, a radio receiver capable of receiving radio-diffused messages. Such a receiver may be used in pager-watches for example.

The frequency F1 generated by high frequency oscillator 10 depends on the surrounding temperature and varies in time, the same as the one generated by oscillator 1.

To stabilise this oscillator 10, a feedback circuit is incorporated in generator G according to the invention.

The frequency F1 of the output signal of oscillator 10 must be measured firstly before this frequency F1 may be regulated.

For practical reasons, the output signal of this oscillator 10 passes, preferably, through divisor 10a so as to obtain a lower frequency which facilitates the measurement.

Next, the output signal of divisor 10a is applied to a counter 11 which counts during a certain time interval T a number $n_T$ of pulses coming from this divisor 10a. The number $n_T$ is thus an indication of the measurement of the frequency F1 provided by high frequency oscillator 10. The output of the counter 11 is associated to comparing means 13 so as to compare the number of pulses counted by counter 11 during the time interval T to a reference number of pulses provided by a memory 14, also associated to comparing means 13. The output of the comparing means 13 is associated to evaluation means 15 which also comprises a memory 16. Means 15 produce a control signal Sc to control a correction circuit 17 associated to high frequency oscillator 10 so as to modify the frequency of its output signal.

The length of time of the measurement, the interval T, is determined by the stabilised time base BT. In fact, signal I outputted by stabilised time base BT is used to control counter 11. To this effect, time base BT provides the frequency stable signal I to counter 11 by way of the divisor 9a which divides the frequency of this signal I so as to obtain a control signal of counter 11 which has a period equal to the desired time length of interval T. For example, if the output signal of time base BT is a signal having a frequency of 1 Hz, and if the desired time length of interval T is to be 8s, the divisor 9a divides signal I by 8 so as to obtain a signal output by divisor 9a which has a frequency of ⅛ Hz which corresponds to pulses which are time-spaced apart by 8s. The first pulse of the signal outputted by divisor 9a may be a control signal which starts counter 11 so as to start the measurement, while the second pulse, arriving T seconds later (here T=8s), may be a stop command of counter 11 thus stopping the measurement.

The result of the measurement of counter 11 is thus a number of pulses counted during the time interval T. Counter 11 then provides this number of pulses $n_T$ to comparing means 13. The number $n_T$ of pulses is compared to a reference number $N_T$ of pulses stocked in memory 14, this number being predetermined and depending on the number of pulses that oscillator 10 should produce during the interval T.

The compare circuit 13 determine the difference $\Delta = |n_T - N_T|$, which is thus representative of the correction to be performed so as to correct frequency F1 of high frequency oscillator 10. To this effect, this value $\Delta$ is applied to evaluation means 15 which comprise a data-instruction table stocked in memory 16 and which provides, for each possible value of $\Delta$, a corresponding correction signal Sc. Thus, the value of $\Delta$ determines the necessary correction as will be explained hereinafter.

Correction signal Sc is a control signal which may be applied to correction circuit 17 so as to modify frequency F1 of the output signal of oscillator 10. Correction circuit 17 comprises for example a network of switchable capacities connected in parallel to the oscillation circuit of oscillator 10. Correction signal Sc controls the connection of the capacities of correction circuit 17 so that the frequency F1 of oscillator 10 may obtain the desired value. A network of switchable capacities as well as its connection being known to the skilled person, they will thus not be described in more detail here.

It will thus be understood that frequency F1 of the output signal of oscillator 10 may be modified and thus stabilised as a function of the information provided by time base BT thus functioning as a reference oscillator in the feedback loop of high frequency oscillator 10.

Figure 4:
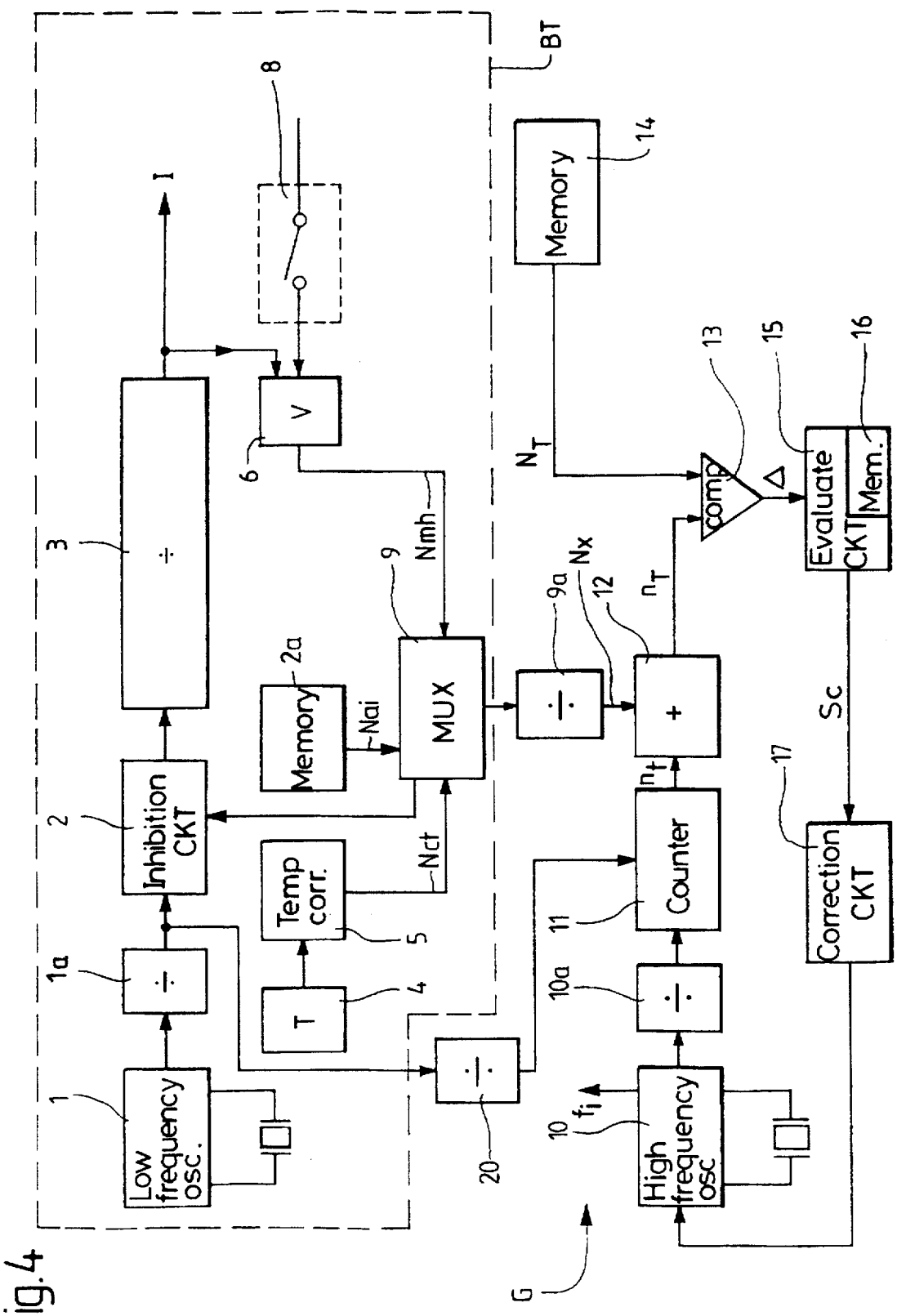
FIG. 4 represents a block diagram of the generator according to the invention in a second embodiment.

FIG. 4 represents a block diagram of the generator according to the invention in a second embodiment.

This embodiment corresponds largely to the first embodiment of FIG. 3, that is to say that a divisor 10a, associated to oscillator 10, is connected to a counter 11. However, here, counter 11 is associated to calculating means 12, for example an adder. The calculating means 12 are associated to comparing means 13, to which is also associated a memory 14. The output of the comparing means pass through evaluation means 15, comprising a memory 16 and providing an output control signal Sc to a correction circuit 17. The correction circuit 17 is associated to the oscillation circuit of the high frequency oscillator 10 so as to modify the frequency F1 of the output signal of oscillator 10.

In the second embodiment, counter 11 is not controlled by the output signal I of the stabilised time base BT, but it is controlled only by the output signal of divisor 1a which determines by way of a divisor 20 the timing of activity of counter 11. As the frequency of the output signal of oscillator 1, and thus the frequency of the output signal of divisor 1a, is not stable in itself, it will generate an error of the length of the time measurement. This time measurement thus has a length t and not T as is the case in the first embodiment. The error (the difference between t and T) caused by the variations due to the temperature, the ageing and the initial adjustment of the resonator of oscillator 1, may be corrected by the compensation information $N_{cr}$, $N_{mh}$ and $N_{ai}$ provided to multiplexer 9. Thus, the error of the measurement due to the length of the interval t may be corrected.

To this effect, multiplexer 9 is connected to a calculating circuit 9a to provide a correction value $N_x$ as will be explained hereafter.

In fact, counter 11 counts during the interval t a number $n_t$ of pulses coming from high frequency oscillator 10 by way of divisor 10a. However, counter 11 will not have counted during T seconds, but only during t seconds. That is to say, if t<T, counter 11 will not have counted long enough, and it is thus necessary to add a number $N_x$ of correction pulses to the result $n_t$ of the count; on the contrary, if t>T, the counter will have counted too long, and it is necessary to substract this number $N_x$ of pulses from number $n_t$.

To this effect, the three values $N_{ai}$, $N_{cr}$, $N_{mh}$ applied to multiplexer 9 pass through a arithmetic circuit 9a arranged in such a way to adapt these values to the conditions of the high frequency loop by effecting the necessary corrections so as to take into account the difference between the frequency F2 of low frequency oscillator 1 and the frequency F1 high frequency oscillator 10, the difference between the interval $I_T$ of the compensation measurement of time base BT and the desired interval T of the measurement, and the interval t of the actual measurement of frequency F1. Furthermore, if the divisors 1a and 10a do not have the same division rate, a correction for the proportion between their rates is also necessary.

More specifically, the arithmetic circuit 9a may be arranged in such a way so as to calculate the correction number $N_x$ with the help of the following equation:

$$N_x = N_{ai} \cdot \frac{F1 \cdot T \cdot d2}{F2 \cdot I_T \cdot d1} + (N_{cr} + N_{mh}) \cdot \frac{F1 \cdot T \cdot d2}{F2 \cdot t \cdot d1}$$

in which d1 and d2 are respectively the division rates of divisor 10a and 1a, and t is the time length of the actual measurement of frequency F1.

It will be understood that the number $N_x$ may be positive or negative, depending of the values of $N_{cr}$ and $N_{ai}$ (always positive), on the one hand, and $N_{mh}$ (positive or negative), on the other hand.

Next, calculation means 12 add the number $N_x$ calculated by the arithmetic circuit 9a to the number $n_t$ of pulses received from counter 11 so as to obtain a number of pulses $n_T = n_t + N_x$.

The result $n_T$ of this addition is compared by comparing means 13 to the reference number $N_T$ of pulses, as in the embodiment of FIG. 3.

The difference $|n_T - N_T| = \Delta$ determined by this comparison is processed by means 15 and 16 in the same way as in the first embodiment so as to generate a correction signal. Thus, here too, evaluation means 15 generate a correction signal Sc to control the correction circuit 17 so as to modify frequency F1 of the output signal of oscillator 10 so as to stabilise this frequency, as described hereabove for the first embodiment shown in FIG. 3.

As has been explained hereabove, generator G according to the invention may advantageously be incorporated into a pager-watch. Time base BT of generator G is then associated to the display means of the pager-watch, and high frequency oscillator 10 of generator G is used as a radio receiver of messages. Thus, the pager-watch has a stable time base as well as a stabilised radio receiver thanks to the frequency generator G according to the invention.

What is claimed is:

1. A frequency generator comprising a first oscillator for generating a first frequency, said frequency generator further comprising: a time base comprising a second oscillator for generating a second frequency, said second frequency being lower than said first frequency, and compensation means for the second oscillator, said time base providing a frequency signal which is stable in time and independent of temperature, means for defining a time interval determined by said stable frequency signal, and feedback means comprising:
- a counter arranged to count a first number of pulses coming from said first oscillator during said time interval,
- means for providing a reference number of pulses,
- comparing means responsive to said counter and said means for providing a reference number of pulses for comparing the first number to the reference number, and
- means for providing a correction signal as a function of the difference between said first number and said reference number, said generator further comprising a correction circuit for correcting the oscillation frequency of said first oscillator, the correction circuit being controlled by said correction signal.

2. A frequency generator comprising a first oscillator for generating a first frequency, said frequency generator further comprising:
- a time base comprising a second oscillator for generating a second frequency, said second frequency being lower than said first frequency, and compensation means for said second oscillator providing a number of correction pulses $N_x$ representative of a correction to be performed, said time base providing a time stable frequency signal which is independent of temperature,
- means for defining a time interval determined by said second oscillator, and
- feedback means comprising:
  - a counter arranged to count a first number of pulses coming from said first oscillator during said time interval,
  - adding means for calculating the sum of said first number and said correction number,
  - means for providing a reference number of pulses,
  - comparing means for comparing said sum calculated by said adding means with said reference number, and
  - means for providing a correction signal as a function of the difference between said sum and said reference number, the generator further comprising a correction circuit of the oscillation frequency of said first oscillator, the correction circuit being controlled by said correction signal.

3. A generator according to claim 1, wherein the compensation means for said second oscillator comprise:
- a temperature compensation circuit of said time base, and
- an ageing compensation circuit of said time base.

4. A generator according to claim 1, wherein the correction circuit is constituted by an network of switchable capacitors comprising one or several capacities, each being connectable in parallel to an oscillation circuit of said first oscillator so as to modify the oscillation circuit frequency.

5. A generator according to claim 2, wherein the compensation means for said oscillator comprise:
- a temperature compensation circuit of said time base and an ageing compensation circuit of said time base.

6. A generator according to claim 2, wherein the correction circuit is constituted by an network of switchable capacitors comprising one or several capacities, each being connectable in parallel to an oscillation circuit of said first oscillator so as to modify the frequency of said oscillation circuit.

7. Timepiece capable of receiving radio-diffused messages, said timepiece comprising at least display means for displaying a time information and receiving means for receiving said messages, wherein said timepiece further comprises a frequency generator which comprises:
- a first oscillator for generating a first frequency,
- a time base comprising a second oscillator for generating a second frequency, said second frequency being lower than said first frequency, and compensation means for the second oscillator, said time base providing a frequency signal which is stable in time and independent of temperature,
- means for defining a time interval determined by said stable frequency signal, and
- feedback means comprising:
  - a counter arranged to count a first number of pulses coming from said first oscillator during said time interval,
  - means for providing a reference number of pulses, and
  - comparing means responsive to said counter and said means for providing a reference number of pulses for comparing the first number to the reference number,
  - means for providing a correction signal as a function of the difference between said first number and said reference number, said generator further comprising a correction circuit for correcting the oscillation frequency of said first oscillator, the correction circuit being controlled by said correction signal, said frequency signal provided by said time base being associated to said display means, and said receiving means further comprising said first oscillator as a radio receiver for said messages.

8. Timepiece capable of receiving radio-diffused messages, said timepiece comprising at least display means for displaying a time information and receiving means for receiving said messages, wherein said timepiece further comprises a frequency generator comprising:
- a first oscillator for generating a first frequency,
- a time base comprising a second oscillator for generating a second frequency, said second frequency being lower than said first frequency, and compensation means for said second oscillator providing a number of correction pulses $N_x$ representative of a correction to be performed, said time base providing a time stable frequency signal which is independent of temperature,
- means for defining a time interval determined by said second oscillator, and
- feedback means comprising:
  - a counter arranged to count a first number of pulses coming from said first oscillator during said time interval
  - adding means for calculating the sum of said first number and said correction number,
  - means for providing a reference number of pulses,
  - comparing means for comparing said sum and said reference number, and
  - means for providing a correction signal as a function of the difference between said sum and said reference number, said generator further comprising a correction circuit for correcting the oscillation frequency of said first oscillator, the correction circuit being controlled by said correction signal, said frequency signal provided by said time base being associated to said display means, and said receiving means further comprising said first oscillator as a radio receiver for said messages.

* * * * *

UNITED STATES PATENT AND TRADEMARK OFFICE
CERTIFICATE OF CORRECTION

PATENT NO. : 5,719,827
DATED : February 17, 1998
INVENTOR(S) : Minh-Tam DIEP et al.

It is certified that error appears in the above-indentified patent and that said Letters Patent is hereby corrected as shown below:

On the title page:

[73] Assignee: Aulab S.A. should be corrected to show

[73] Assignee: Asulab S.A.

Signed and Sealed this

Second Day of June, 1998

Attest:

BRUCE LEHMAN

Attesting Officer

Commissioner of Patents and Trademarks